(12) United States Patent
Hshieh (10) Patent No.: US 7,041,560 B2
(45) Date of Patent: May 9, 2006

(54) METHOD OF MANUFACTURING A SUPERJUNCTION DEVICE WITH CONVENTIONAL TERMINATIONS

(75) Inventor: Fwu-Iuan Hshieh, Saratoga, CA (US)

(73) Assignee: Third Dimension (3D) Semiconductor, Inc., Tempe, AZ (US)

( * ) Notice: Subject to any disclaimer, the term of this patent is extended or adjusted under 35 U.S.C. 154(b) by 0 days.

(21) Appl. No.: 11/009,678

(22) Filed: Dec. 10, 2004

(65) Prior Publication Data

US 2005/0181558 A1   Aug. 18, 2005

Related U.S. Application Data

(60) Provisional application No. 60/531,501, filed on Dec. 19, 2003.

(51) Int. Cl.
*H01L 21/336* (2006.01)
*H01L 21/8238* (2006.01)

(52) U.S. Cl. .................. 438/268; 438/212; 438/282; 438/289; 438/514

(58) Field of Classification Search ............. 438/272, 438/212, 282
See application file for complete search history.

(56) References Cited

U.S. PATENT DOCUMENTS

| | | | |
|---|---|---|---|
| 4,158,206 A | 6/1979 | Neilson |
| 4,895,810 A | 1/1990 | Meyer et al. |
| 5,019,522 A | 5/1991 | Meyer et al. |
| 5,045,903 A | 9/1991 | Meyer et al. |
| 5,216,275 A | 6/1993 | Chen |
| 5,366,914 A | 11/1994 | Takahashi et al. |
| 5,435,888 A | 7/1995 | Kalnitsky et al. |
| 5,472,888 A | 12/1995 | Kinzer |
| 5,506,421 A | 4/1996 | Palmour |
| 5,598,018 A | 1/1997 | Lidow et al. |
| 5,742,087 A | 4/1998 | Lidow et al. |
| 5,744,994 A | 4/1998 | Williams |
| 5,786,619 A | 7/1998 | Kinzer |
| 5,902,127 A | 5/1999 | Park |
| 5,929,690 A | 7/1999 | Williams |
| 5,939,754 A | 8/1999 | Hoshi |
| 6,081,009 A * | 6/2000 | Neilson ................ 257/341 |
| 6,184,555 B1 | 2/2001 | Tihanyi et al. |
| 6,190,970 B1 | 2/2001 | Liao et al. |
| 6,198,127 B1 | 3/2001 | Kocon |
| 6,214,698 B1 | 4/2001 | Liaw et al. |
| 6,222,229 B1 | 4/2001 | Herbert et al. |
| 6,239,463 B1 | 5/2001 | Williams et al. |

(Continued)

*Primary Examiner*—Ha Nguyen
*Assistant Examiner*—Cheung Lee
(74) *Attorney, Agent, or Firm*—Akin Gump Strauss Hauer & Feld, LLP (57) ABSTRACT

A method of manufacturing a semiconductor device includes providing a semiconductor substrate having a heavily doped region of a first conductivity and has a lightly doped region of the first conductivity. The semiconductor substrate a plurality of trenches etched into an active region of the substrate forming a plurality of mesas. A preselected area in the active region is oxidized and then etched using a dry process oxide etch to remove the oxide in the bottoms of the trenches. A protective shield is formed over a region at a border between the active region and the termination region. The protective shield is partially removed from over the preselected area. Dopants are implanted at an angle into mesas in the preselected area. The plurality of trenches are with an insulating material, the top surface of the structure is planarized and a superjunction device is formed on the structure.

20 Claims, 9 Drawing Sheets

U.S. PATENT DOCUMENTS

| | | |
|---|---|---|
| 6,265,281 B1 | 7/2001 | Reinberg |
| 6,291,856 B1 | 9/2001 | Miyasaka et al. |
| 6,300,171 B1 | 10/2001 | Frisina |
| 6,307,246 B1 | 10/2001 | Nitta et al. |
| 6,359,309 B1 | 3/2002 | Liao et al. |
| 6,362,505 B1 | 3/2002 | Tihanyi |
| 6,391,723 B1 | 5/2002 | Frisina |
| 6,410,958 B1 * | 6/2002 | Usui et al. .................. 257/329 |
| 6,452,230 B1 | 9/2002 | Boden, Jr. |
| 6,459,124 B1 | 10/2002 | Zhang et al. |
| 6,465,325 B1 | 10/2002 | Ridley et al. |
| 6,495,421 B1 | 12/2002 | Luo |
| 6,501,130 B1 | 12/2002 | Disney |
| 6,501,146 B1 | 12/2002 | Harada |
| 6,504,230 B1 | 1/2003 | Deboy et al. |
| 6,509,220 B1 | 1/2003 | Disney |
| 6,635,906 B1 | 10/2003 | Chen |
| 2002/0070418 A1 | 6/2002 | Kinzer et al. |

* cited by examiner

FIG. 1

← Termination Region → ← Active Region → ← Termination Region →

METHOD OF MANUFACTURING A SUPERJUNCTION DEVICE WITH CONVENTIONAL TERMINATIONS

CROSS-REFERENCE TO RELATED APPLICATIONS

This application claims priority to U.S. Provisional Patent Application No. 60/531,501, filed Dec. 19, 2003, entitled "Methods of Manufacturing a Superjunction Device with Conventional Terminations."

BACKGROUND OF THE INVENTION

The present invention relates to a method for manufacturing a semiconductor device having an edge termination structure that includes a non-implanted outer sidewall of the last trench of the active region, and particularly to a semiconductor device which is metal-oxide semiconductor (MOS)-gated, and that is suitable for power switching, having both a low on-resistance and a high breakdown voltage.

Since the invention of superjunction devices by Dr. Xingbi Chen, as disclosed in U.S. Pat. No. 5,216,275, there have been many attempts to expand and improve on the superjunction effect of his invention. U.S. Pat. Nos. 6,410,958, 6,300,171 and 6,307,246 are examples of such efforts and are incorporated herein by reference.

U.S. Pat. No. 6,410,958 ("Usui, et al.") relates to an edge termination structure and a drift region for a semiconductor component. A semiconductor body of the one conductivity type has an edge area with a plurality of regions of the other conductivity type embedded in at least two mutually different planes. Underneath the active zone of the semiconductor component, the drift regions are connected using the underlying substrate.

U.S. Pat. No. 6,307,246 ("Nitta, et al.") discloses a semiconductor component having a high-voltage sustaining edge structure in which a multiplicity of parallel-connected individual components are disposed in a multiplicity of cells of a cell array. In an edge region, the semiconductor component has cells with shaded source zone regions. During commutation of the power semiconductor component, the shaded source zone regions suppress the switching "on" of a parasitic bipolar transistor caused by the disproportionately large reverse flow current density. Moreover, an edge structure having shaded source zone regions can be produced very easily in technological terms that are discussed in the Nitta, et al. patent. It clarifies the effects of parameters and enables the mass production of a superjunction semiconductor device which has a drift layer composed of a parallel PN layer that conducts electricity in the "on" state and is depleted in the "off" state. The net quantity of active impurities in the N-type drift regions is within the range of 100% to 150% of the net quantity of active impurities in the P-type partition regions. In addition, the width of either one of the N-type drift regions and the P-type partition regions is within the range between 94% and 106% of the width of the other regions.

U.S. Pat. No. 6,300,171 ("Frisina") discloses a method for manufacturing an edge structure for a high voltage semiconductor device, including a first step of forming a first semiconductor layer of a first conductivity type, a second step of forming a first mask over the top surface of the first semiconductor layer, a third step of removing portions of the first mask in order to form at least one opening in it, a fourth step of introducing dopant of a second conductivity type in the first semiconductor layer through the at least one opening, a fifth step of completely removing the first mask and of forming a second semiconductor layer of the first conductivity type over the first semiconductor layer, a sixth step of diffusing the dopant implanted in the first semiconductor layer in order to form a doped region of the second conductivity type in the first and second semiconductor layers. The second step up to the sixth step are repeated at least one time in order to form a final edge structure including a number of superimposed semiconductor layers of the first conductivity type and at least two columns of doped regions of the second conductivity type, the columns being inserted in the number of superimposed semiconductor layers and formed by superimposition of the doped regions subsequently implanted through the mask openings, the column near the high voltage semiconductor device being deeper than the column farther from the high voltage semiconductor device.

It is desirable to provide an edge termination region with the outer sidewall of the last trench of the active region not having been implanted, and that is manufactured using a technique compatible with a process using only a single epitaxial deposition step to manufacture the device.

BRIEF SUMMARY OF THE INVENTION

Briefly stated, the present invention comprises a method of manufacturing a semiconductor device that includes providing a semiconductor substrate having first and second main surfaces opposite to each other. The semiconductor substrate has a heavily doped region of a first conductivity type at the second main surface and having a lightly doped region of the first conductivity type at the first main surface. The method includes etching in the semiconductor substrate a plurality of trenches and a plurality of mesas in an active region of the substrate. Each trench has a first extending portion extending from the first main surface toward the heavily doped region to a first depth position, and each mesa has a sidewall surface with a predetermined inclination maintained relative to the first main surface. Each of the plurality of trenches is separated from each of the other trenches by one of the plurality of mesas. The method includes oxidizing a preselected area of the plurality of mesas and the plurality of trenches in the active region and extending into a termination region of the substrate which is outside and adjacent to the active region, until the oxidization covers the top of each mesa, the sidewalls and the bottoms of each of the plurality of trenches and the top of the termination region. The method includes etching the preselected area of the plurality of mesas and the plurality of trenches using a dry process oxide etch to remove the oxide in the bottoms of the plurality of trenches. The method includes forming a protective shield over a preselected region at a border between the active region and the termination region, and then partially removing the protective shield from over the preselected area of the plurality of mesas and the plurality of trenches. The method includes implanting, at a first predetermined angle of implant, a dopant of the first conductivity type into at least one preselected mesa of the preselected area of the plurality of mesas and the plurality of trenches at an adjacent pair of the plurality of trenches at a sidewall surface of one trench to form at the sidewall surface of the one trench a first doped region of the first conductivity type having a doping concentration lower than that of the heavily doped region. The method includes implanting, at a second predetermined angle of implant, a dopant of the second conductivity type into the at least one mesa of the preselected area of the plurality of mesas and the plurality of trenches at a sidewall surface of the at least one mesa opposite to the sidewall implanted with the dopant of the first conductivity type to provide a second doped region of the second conductivity type at the sidewall surface opposite to the sidewall implanted with the dopant of the first conductivity type to form a P-N junction of the first and second doped regions located along the depth direction of at least one of the plurality of trenches and to provide non-implanted outer sidewalls of the active region. The method includes filling the plurality of trenches with an insulating material, planarizing the top surface of the structure and forming a superjunction device on the structure.

In a second embodiment of the invention, a method for manufacturing a semiconductor includes providing a semiconductor substrate having first and second main surfaces. The substrate has a heavily doped region of a first conductivity type at the second main surface and a lightly doped region of the first conductivity type at the first main surface. A plurality of trenches and a plurality of mesas are formed in the substrate, each trench having a first portion extending from the first main surface toward the heavily doped region to a first depth position while having a sidewall surface with a pre-determined inclination maintained relative to the first main surface, each one of the plurality being separated from another by a mesa region. In the following step, an oxide deposition is performed to cover the top of each mesa and the sidewalls and bottom of each trench with a thick layer of oxide. The method includes applying a dry oxide etch to remove the oxide on the sidewalls and in the bottom of each trench. Then, a mask is positioned over the trenches and mesas of the preselected area, except for the last trench and a portion of the mesas adjoining the trench. Photoresist is deposited, and the mask removed. The method includes implanting of the selected region of trenches and mesas is performed. However, with the photoresist in place over the last trench, implantation in this trench is blocked. Blocking implantation of the last trench on the opposite end of the structure is accomplished in the same manner. A mask is positioned to allow photoresist to be deposited in the last trench and over a portion of the adjoining mesas, and the mask removed. Implantation in this trench is also blocked by the photoresist. The blocking of implantation of the last trench prevents degradation of the avalanche breakdown voltage of a device formed on this substrate. The photoresist is removed from the trenches and mesas after implantation. After the last trench is cleared, all of the trenches are then filled with an insulating material, and the top surface of the device is planarized. The substrate is then ready for construction of a superjunction device.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For purposes of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a", as used in the claims and in the corresponding portions of the specification, means "at least one."

FIGS. 1–11 generally show a process for manufacturing a superjunction device with conventional terminations in accordance with a first preferred embodiment of the present invention.

Figure 1:
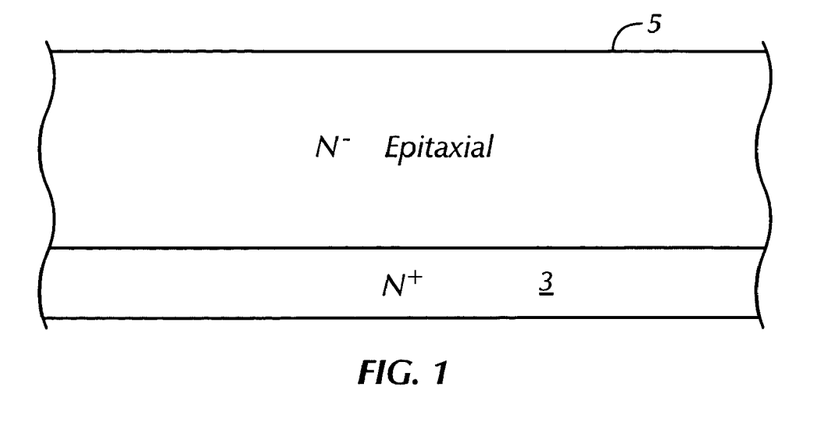
FIG. 1 is a partial sectional elevational view of a semiconductor substrate with an epitaxial layer applied thereto in accordance with a first preferred embodiment of the present invention.

Referring to FIG. 1, there is shown a partial view of a semiconductor wafer that includes a heavily doped $N^+$ substrate 3 and a lightly doped $N^-$ layer 5. As used herein, reference to conductivity will be limited to the embodiment described. However, those skilled in the art know that P-type conductivity can be switched with N-type conductivity and the device would still be functionally correct (i.e., using a first or a second conductivity type). Therefore, where used herein, the reference to N or P can also mean that either N and P or P and N can be substituted.

Figure 2:
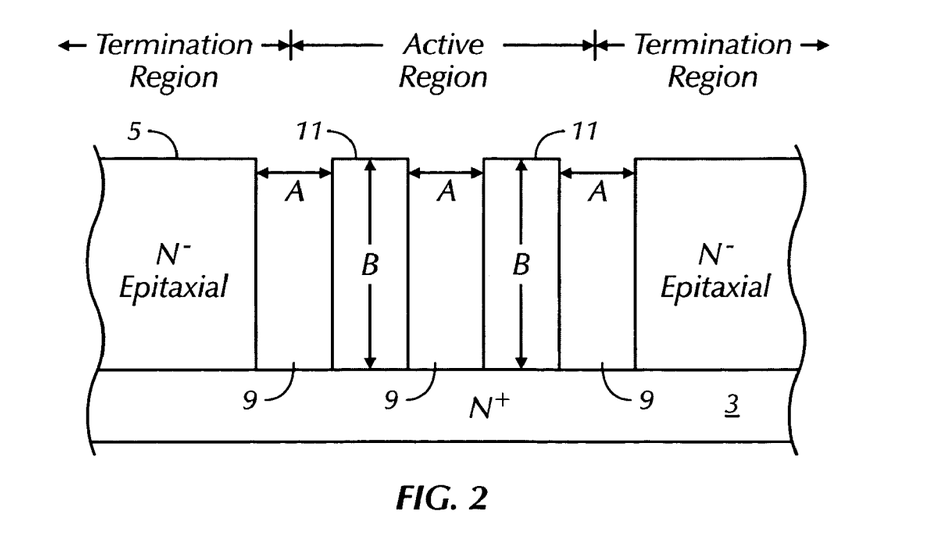
FIG. 2 is a partial sectional elevational view of the semiconductor substrate and epitaxial layer of FIG. 1 after etching of trenches in the epitaxial layer.

Referring to FIG. 2, using techniques known in the art, the $N^-$ layer 5 is etched so that the bottom of an etched trench touches or approaches the interface between the $N^+$ substrate 3 and the $N^-$ layer 5. The etch process creates trenches 9 and mesas 11. The mesas 11 are referred to as device mesas because the mesas 11 are in an active region, as opposed to a surrounding termination region, where the process creates the structure on which transistor devices will be fabricated. The width A of each of the trenches 9 adjacent to mesas 11 is about the same relative to the other trenches 9. Though not shown clearly, the trenches 9 are preferably wider at their tops by 1%–10% than at their bottoms to facilitate the trench fill process. Thus, the mesas 11 have sidewall surfaces with a predetermined inclination maintained relative to a first main surface of the epitaxial layer 5. The trenches 9 extend from the first main surface of the epitaxial layer 5 toward the substrate (heavily doped region) 3 to a first depth position by depth B, but not necessarily all the way to the substrate (heavily doped region) 3.

Figure 3:
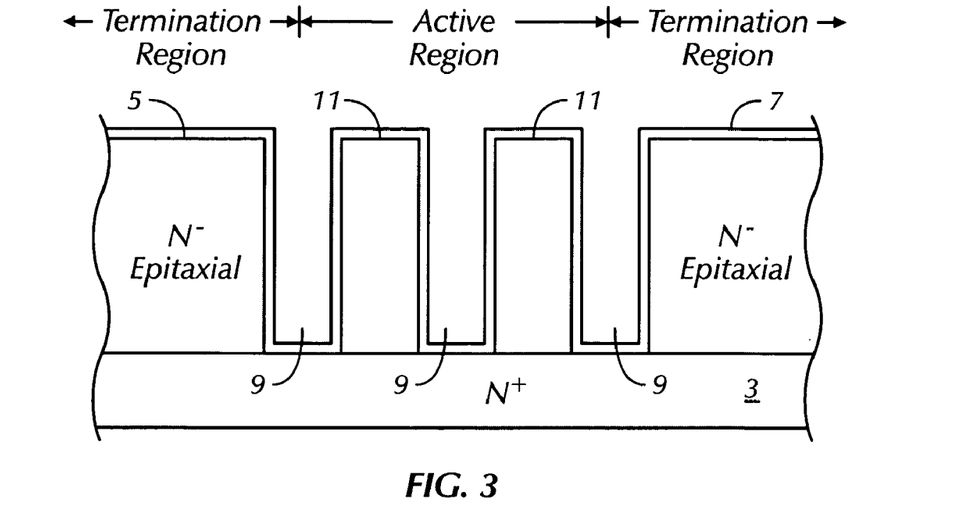
FIG. 3 is a partial sectional elevational view of the structure of FIG. 2 after an oxide deposition step is performed.

FIG. 3 shows a plurality of mesas 11 and a plurality of trenches 9, after a chemical vapor deposition (CVD) process covers the top of each mesa 11 and each trench 9 with a layer of oxide 7 from about 1–3 micrometers or microns (μm) in depth.

Figure 4:
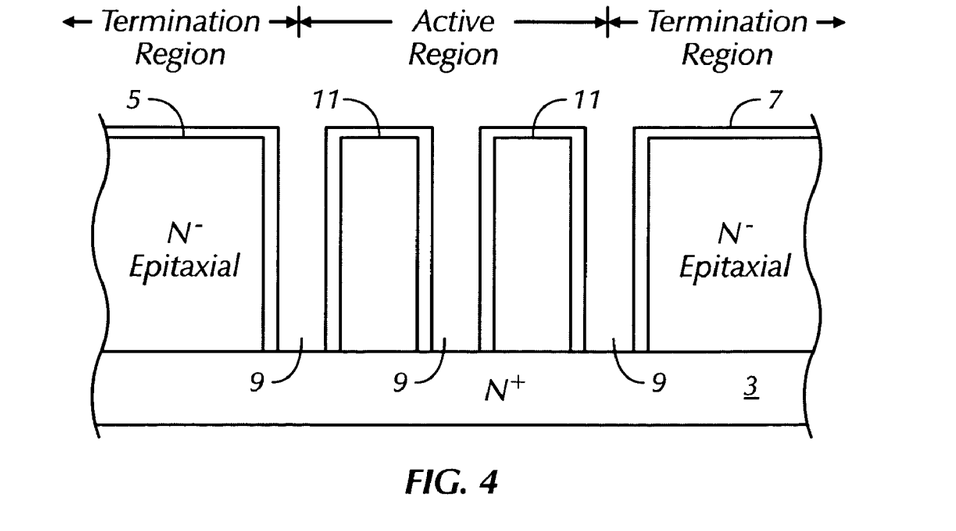
FIG. 4 is a partial sectional elevational view of the structure of FIG. 3 after a dry etch step.

FIG. 4 shows the structure of FIG. 3 after a dry process oxide etch step of a type well known in the art has removed the oxide 7 from the bottom of each of the plurality of trenches 9.

Figure 5:
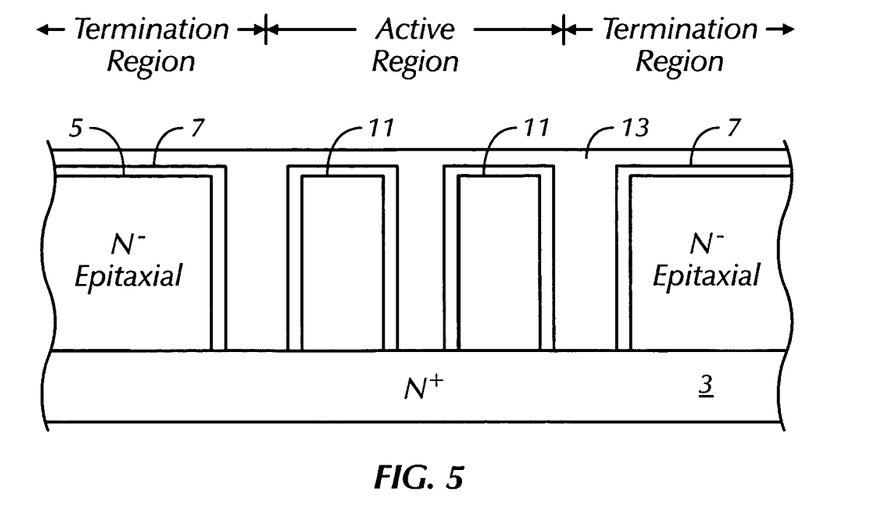
FIG. 5 is a partial sectional elevational view of the structure of FIG. 4 after deposition of a layer of photoresist.

FIG. 5 shows the structure of FIG. 4 after deposition of a layer of photoresist 13 in a manner well known to those skilled in the art.

Figure 6:
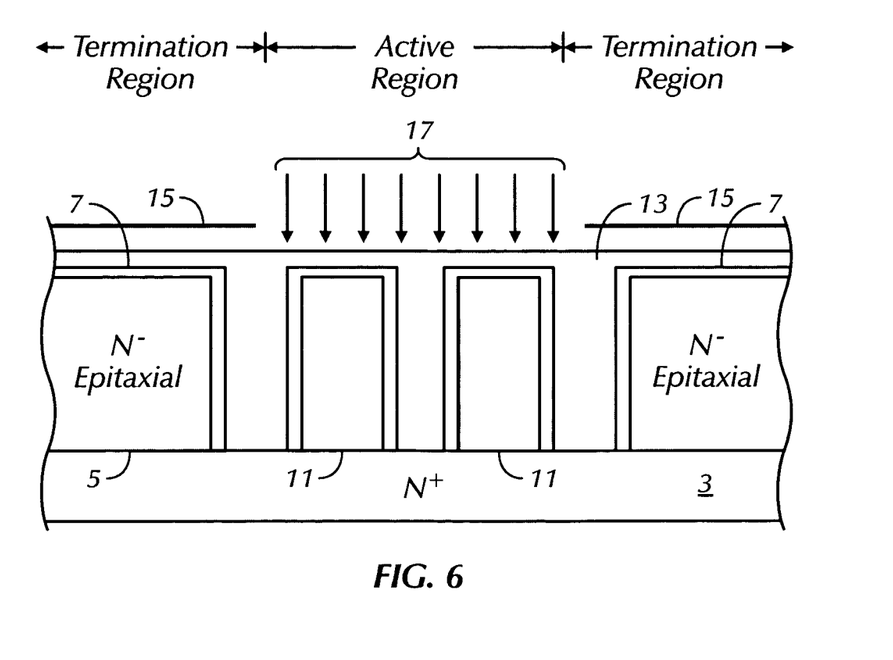
FIG. 6 is a partial sectional elevational view of the structure of FIG. 5 showing a mask in place and a development medium applied to the unprotected area.

FIG. 6 shows the structure of FIG. 5 with a mask 15 (i.e., a protective shield) in place and a known development medium 17 being applied to the unprotected photoresist 13 not protected by the mask 15. The mask 15 is preferably positioned over all of the termination region and a portion of the active region at a preselected region proximate a border between the active region and the termination region. The known development medium 17 may include ultraviolet light, deep ultraviolet light, electron beams, X-rays and the like.

Figure 7:
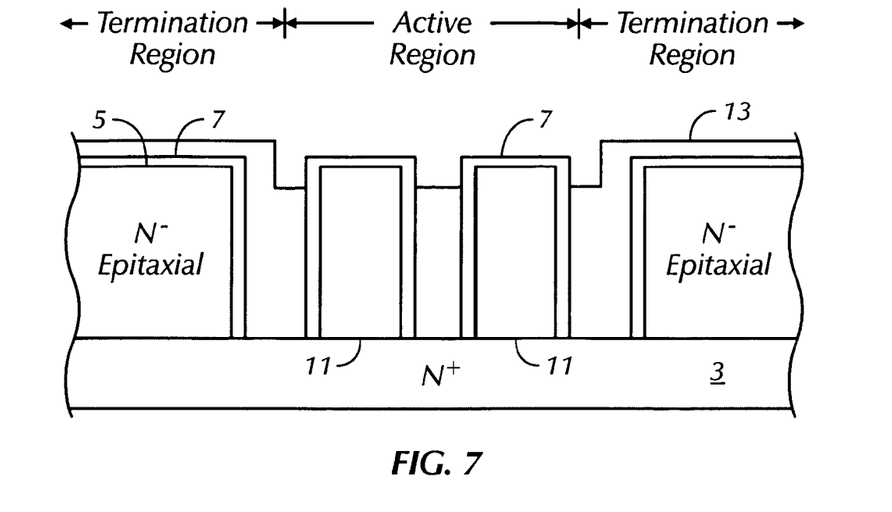
FIG. 7 is a partial sectional elevational view of the structure of FIG. 6 after the developed photoresist is removed.

FIG. 7 shows the structure of FIG. 6 after the developed photoresist 13 has been removed and the undeveloped photoresist 13 (i.e., previously under the mask 15) remains in place as is known in the art.

Figure 8:
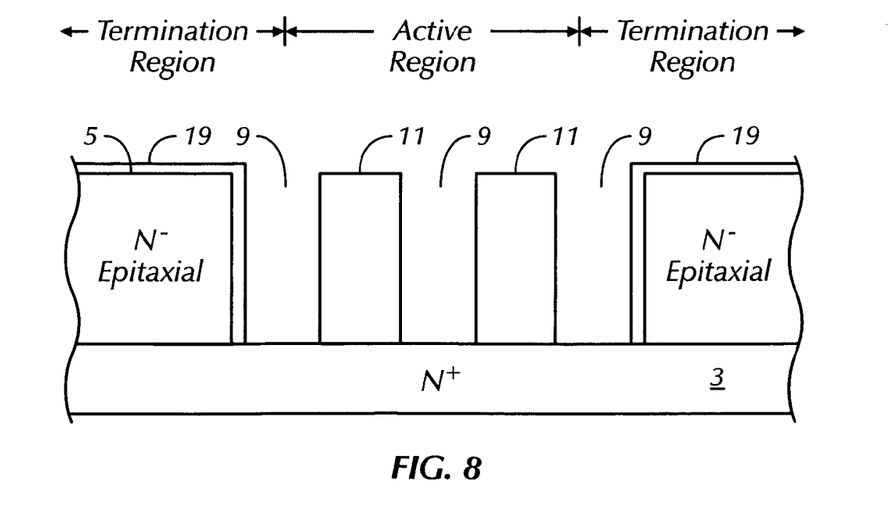
FIG. 8 is a partial sectional elevational view of the structure of FIG. 7 after a wet oxide etch removes the remaining photoresist, and the oxide except for that on the outer sidewall of the last trench in the active area.

FIG. 8 shows the structure of FIG. 7 after a wet oxide etch step removes the photoresist 13 and remaining oxide 7, except for the oxide 19 on the outer sidewall of the last trench 9 on each side of the active region and on the top surface of the termination region.

Figure 9:
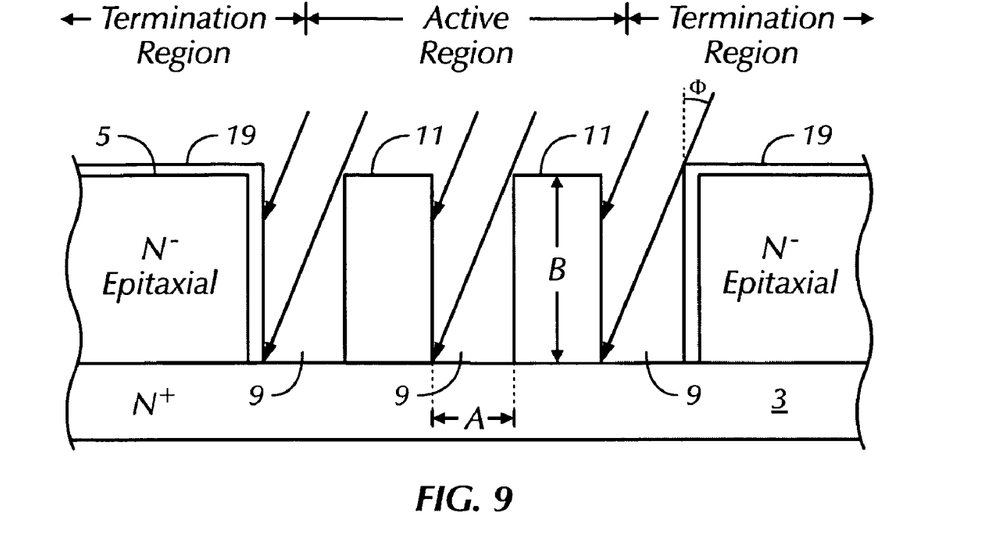
FIG. 9 is a partial sectional elevational view of the structure of FIG. 8 showing an ion implant at a first angle of implant.

FIG. 9 shows an ion implant in the structure of FIG. 8 from a first predetermined angle Φ (i.e., first predetermined angle of implant Φ). The first predetermined angle of implant Φ is determined by the width A and depth B of the trenches 9 (i.e., A/B=tangent of the implant angle Φ) which is typically from about 2° to 12° from vertical. The implant is done at an angle Φ so that the bottom of each trench 9 is not implanted. Implantation of the bottom of trenches 9 is avoided so that diffusion of the implant to surrounding areas does not occur. The implant is performed at an energy level of about 30–200 kilo-electron-volts (KeV) with dose ranges from about 1E13 to 1E14 $cm^{-2}$ (i.e., about $1\times10^{13}$ to $1\times10^{14}$ $cm^{-2}$). Consequently, a dopant of the first conductivity type is implanted, at a first predetermined angle of implant Φ, into at least one preselected mesa 11 of the preselected area of the plurality of mesas 11 and the plurality of trenches 9 at an adjacent pair of the plurality of trenches 9 at a sidewall surface of one trench 9, to form at the sidewall surface of the one trench 9 a first doped region of the first conductivity type having a doping concentration lower than that of the heavily doped region. As shown, the oxide 19 on the outer sidewall of the last trench 9 (left side of FIG. 9) blocks implantation of that surface.

Figure 10:
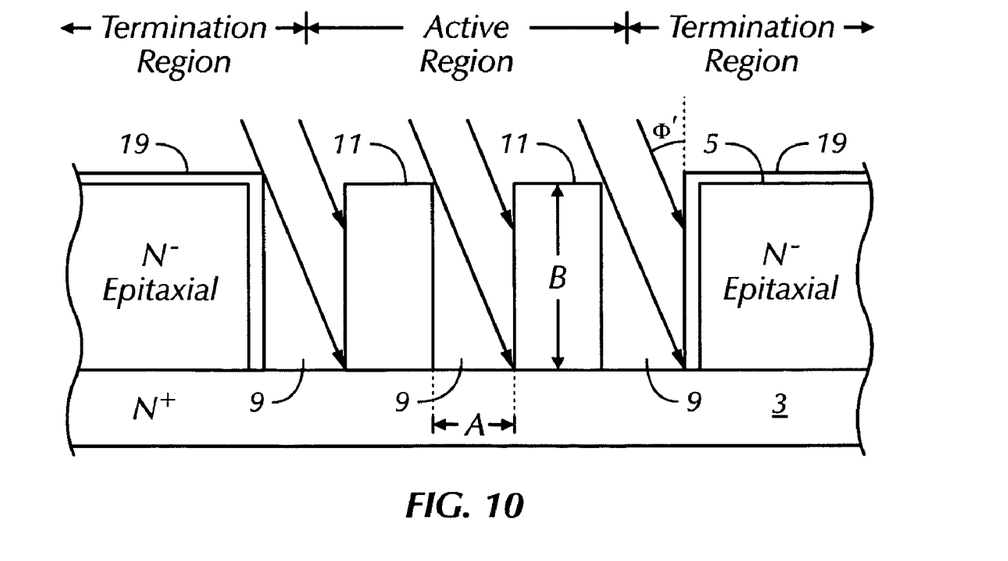
FIG. 10 is a partial sectional elevational view of the structure of FIG. 8 showing an ion implant at a second angle of implant.

FIG. 10 shows an ion implant in the structure of FIG. 9 from a second predetermined angle Φ' (i.e., second predetermined angle of implant Φ'). The second predetermined angle of implant Φ' is also determined by the width A and depth B of the trenches 9 (i.e., −(A/B)=tangent of the implant angle Φ') which is typically from about −2° to −12° from vertical. The implant is done at an angle Φ' so that the bottom of each trench 9 is not implanted. It should be noted that the first predetermined angle of implant Φ and the second predetermined angle Φ' may be about the same magnitude or may be slightly different. Implantation of the bottom of trenches is avoided so that diffusion of the implant to surrounding areas does not occur. The implant is performed at an energy level of about 30–200 KeV with dose ranges from about 1E13 to 1E14 $cm^{-2}$. Consequently, a dopant of the second conductivity type is implanted, at a second predetermined angle of implant Φ', into the at least one mesa 11 of the preselected area of the plurality of mesas 11 and the plurality of trenches 9, at a sidewall surface of the at least one mesa 11 opposite to the sidewall implanted with the dopant of the first conductivity type to provide a second doped region of the second conductivity type at the sidewall surface opposite to the sidewall implanted with the dopant of the first conductivity type, to form a P-N junction of the first and second doped regions located along the depth direction of at least one of the plurality of trenches 9 and to provide non-implanted outer sidewalls of the active region. As shown, the oxide 19 on the outer sidewall of the last trench 9 (right side of FIG. 10) blocks implantation of that surface.

Figure 11:
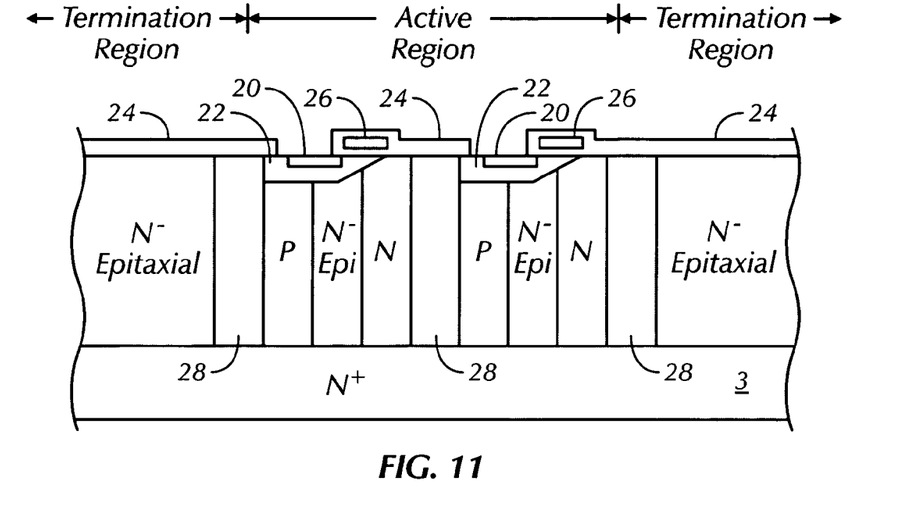
FIG. 11 is a partial sectional elevational view showing a superjunction device formed on the structure of FIG. 10.

FIG. 11 shows a superjunction device formed on the structure of FIG. 10 after the oxide 19 is removed from the trenches 9 in the structures of FIGS. 9 and 10. All of the trenches 9 are filled with an insulating material 28, and the surface is planarized. Manufacture of a superjunction device on the structure follows by performing an implant 22, depositing the gate 20 in the implanted region and adding the gate conductor 26 and gate oxide 24, all done using methods well known in the art. Hence, the gate electrode layer 20 is formed in at least one of the trenches 9 and is formed on the first main surface. The gate electrode layer 20 is in ohmic contact with the first doped region. Preferably, the gate electrode layer 20 is in Schottky contact with the first doped region.

The performance of devices built or formed on this structure have enhanced avalanche breakdown voltage ($V_b$) characteristics as compared to conventional semiconductor-transistor devices. Thus, additional implants can also be provided such as by providing a third doped region of the second conductivity type at the first main surface of the first and second doped regions which are electrically connected to the second doped region and by providing a fourth doped region of the first conductivity type at one or both of the first main surface and a sidewall surface of the one trench 9 such that the fourth doped region is opposite to the first doped region with the third doped region posed therebetween. The gate electrode layer 20 is provided opposite to the third doped region between the first and fourth doped regions, with a gate insulation layer 24 interposed therebetween.

Preferably, a diffusion length of each of the dopants of the first and second conductivity types in manufacturing the semiconductor device is longer than a distance from the sidewall surfaces of the adjacent pair of trenches 9 to the P-N junction of the first and second doped regions.

FIGS. 12–17 generally show a process for manufacturing a superjunction device with conventional terminations in accordance with a second preferred embodiment of the present invention.

Figure 12:
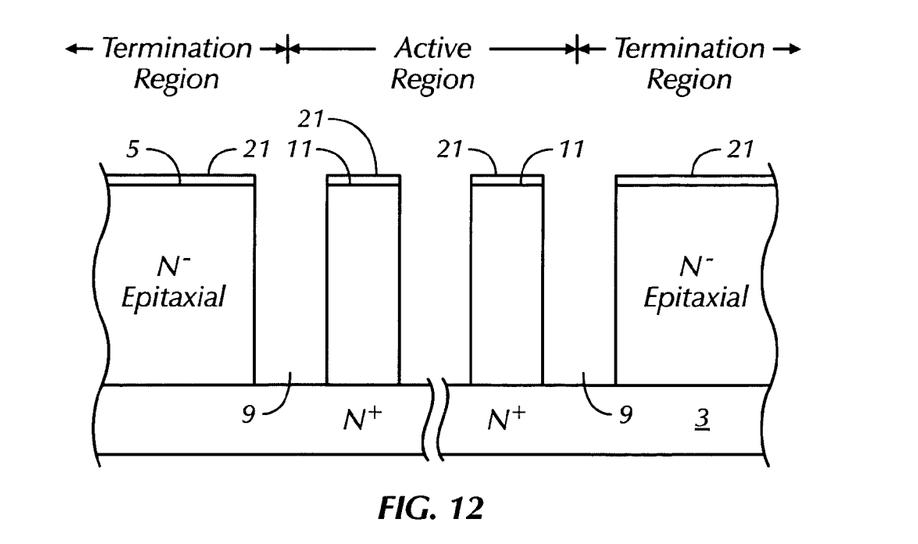
FIG. 12 is a partial sectional elevational view showing the structure of FIG. 2 after an oxide deposition and subsequent etch of the trench sidewalls and bottoms in accordance with a second preferred embodiment of the present invention.

FIG. 12 shows the structure of FIG. 2 after an oxide deposition 21 and subsequent etch of the sidewalls and bottoms of the trenches 9.

Figure 13:
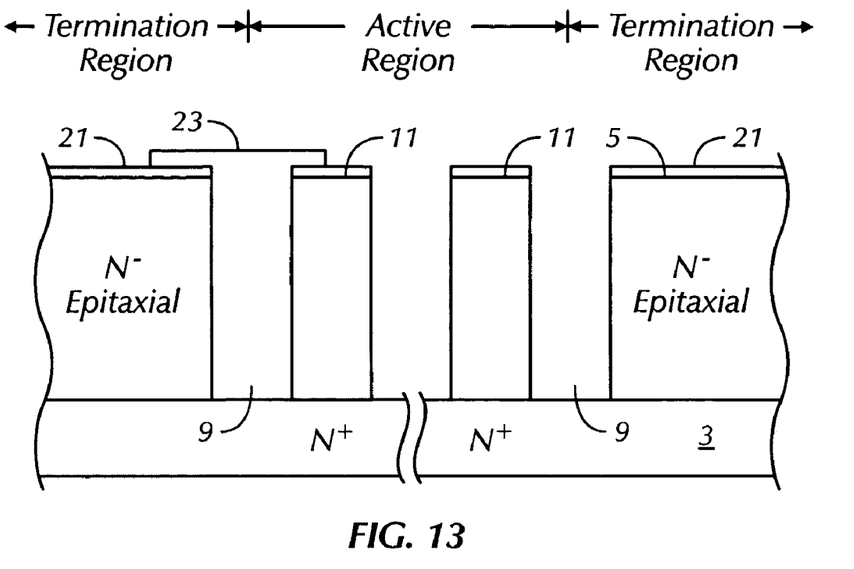
FIG. 13 is a partial sectional elevational view showing the structure of FIG. 12 after a masking and deposition of photoresist in the last trench of one side of the structure.

FIG. 13 shows the structure of FIG. 12 after a mask (not shown but similar to mask 15 in FIG. 6) has been placed for deposition of photoresist 23 only in the last trench of one side (left side) of the active region and portions of the adjacent mesa areas, and photoresist 23 has been deposited. The photoresist 23 blocks implantation of the trench sidewalls.

Figure 14:
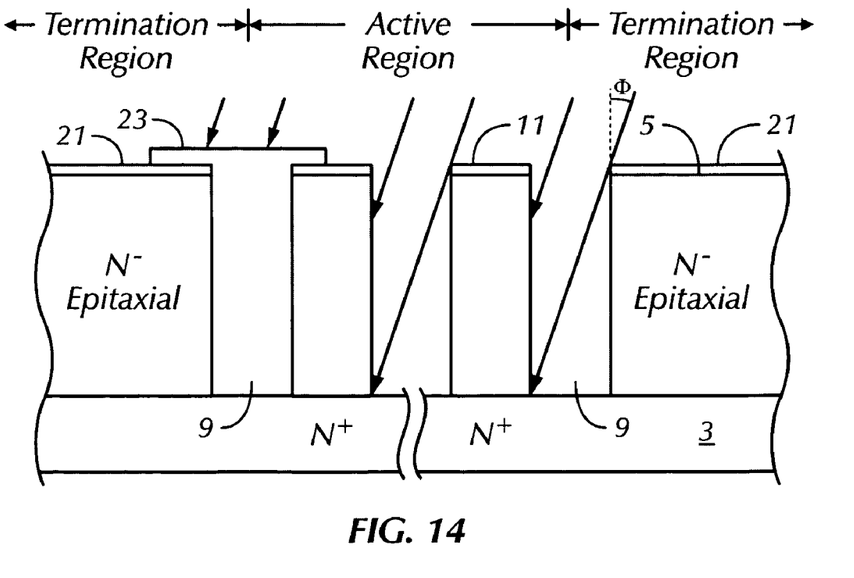
FIG. 14 is a partial sectional elevational view of the structure of FIG. 13 showing an ion implant from a certain first angle.

FIG. 14 shows an ion implant in the structure of FIG. 13 from a first predetermined angle $\Phi$. The first predetermined angle $\Phi$ is determined by the width A and depth B of the trenches 9 (A/B=tangent of the implant angle $\Phi$) which is typically from about 2° to 12° from vertical. The implant is done at an angle $\Phi$ so that the bottom of each trench 9 is not implanted. Implantation of the bottom of trenches 9 is avoided so that diffusion of the implant to surrounding areas does not occur. The implant is performed at an energy level of about 30–200 KeV with dose ranges from about 1E13 to 1E14 cm$^{-2}$. Consequently, a dopant of the first conductivity type is implanted, at a first predetermined angle of implant $\Phi$, into at least one preselected mesa 11 of the preselected area of the plurality of mesas 11 and the plurality of trenches 9 at an adjacent pair of the plurality of trenches 9 at a sidewall surface of one trench 9, to form at the sidewall surface of the one trench 9 a first doped region of the first conductivity type having a doping concentration lower than that of the heavily doped region. As shown, the photoresist 23 in the last trench 9 (left side) blocks implantation of that trench 9.

Figure 15:
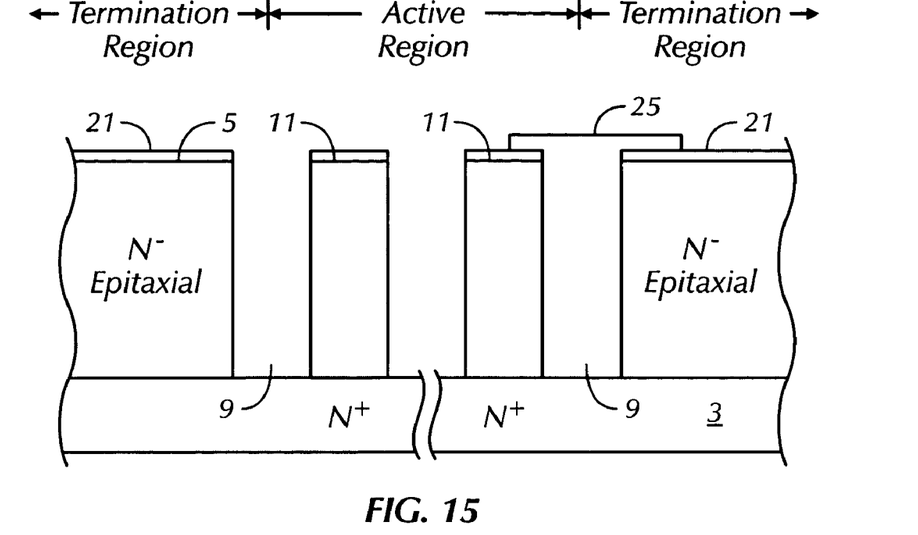
FIG. 15 is a partial sectional elevational view showing the structure of FIG. 12 after a masking and deposition of photoresist in the last trench of the side of the structure opposite to that of FIG. 13.

FIG. 15 shows the structure of FIG. 14 after a mask (not shown but similar to mask 15 in FIG. 6) has been placed for deposition of photoresist 25 only in the last trench 9 (right side) and portions of adjacent mesa areas of the side of the active region opposite to the location of the photoresist deposition 25 in FIG. 13, and photoresist 25 has been deposited. The photoresist 25 blocks implantation of the trench sidewalls.

Figure 16:
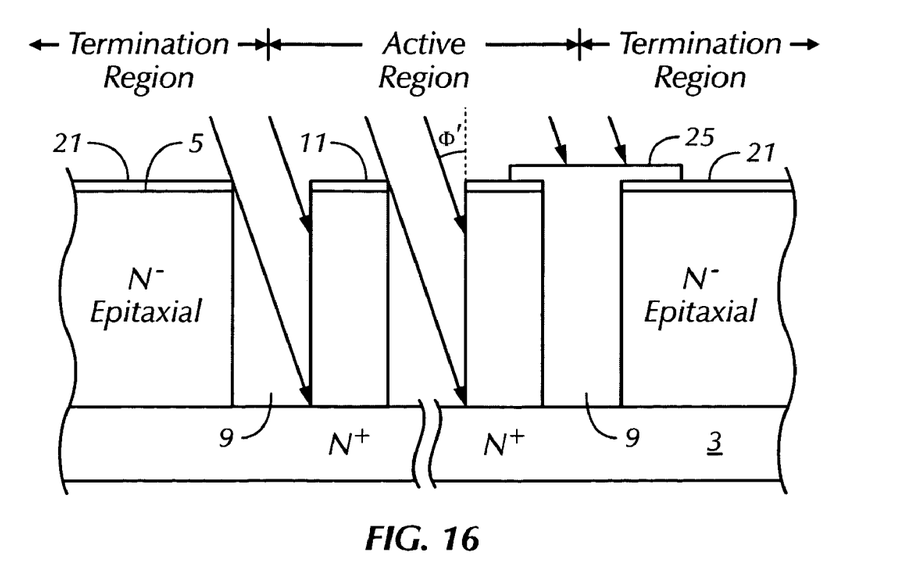
FIG. 16 is a partial sectional elevational view of the structure of FIG. 15 showing an ion implant from a certain second angle.

FIG. 16 shows an ion implant in the structure of FIG. 15 from a second predetermined angle $\Phi'$ (i.e., second predetermined angle of implant $\Phi'$). The second predetermined angle of implant $\Phi'$ is determined by the width A and depth B of the trenches (i.e., $-(A/B)$=tangent of the implant angle $\Phi'$) which is typically from about $-2°$ to $-12°$ from vertical. The implant is done at an angle $\Phi'$ so that the bottom of each trench 9 is not implanted. Implantation of the bottom of trenches 9 is avoided so that diffusion of the implant to surrounding areas does not occur. The implant is performed at an energy level of about 30–200 KeV with dose ranges from about 1E13 to 1E14 cm$^{-2}$. Consequently, a dopant of the second conductivity type is implanted, at a second predetermined angle of implant $\Phi'$, into the at least one mesa 11 of the preselected area of the plurality of mesas 11 and the plurality of trenches 9, at a sidewall surface of the at least one mesa 11 opposite to the sidewall implanted with the dopant of the first conductivity type to provide a second doped region of the second conductivity type at the sidewall surface opposite to the sidewall implanted with the dopant of the first conductivity type, to form a P-N junction of the first and second doped regions located along the depth direction of at least one of the plurality of trenches 9 and to provide non-implanted outer sidewalls of the active region. As shown, the photoresist 25 in the last trench 9 (right side) blocks implantation of that trench 9.

Thus, it can be seen that in the second preferred embodiment, with the photoresist 23, 25 in place over the last trench 9 (right or left in the figures, respectively), implantation in the last trench 9 is blocked. Blocking implantation of the last trench 9 on the opposite end of the structure is accomplished in the same manner. The blocking of implantation of the last trench 9 (right and left in the figures) prevents degradation of the avalanche breakdown voltage ($V_b$) of a device formed on such a substrate. The photoresist 23, 25 is removed from the trenches 11 and mesas 9 after implantation.

Figure 17:
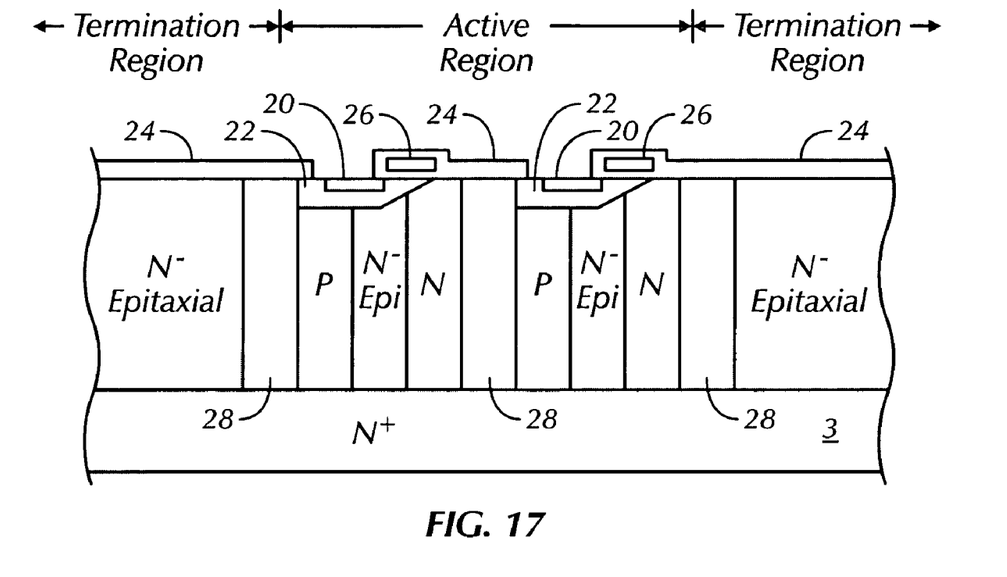
FIG. 17 is a partial sectional elevational view showing a superjunction device formed on the structure of FIG. 16.

FIG. 17 shows the structure of FIG. 16, after photoresist 23, shown in FIG. 14, and photoresist 25, shown in FIG. 16, is removed from the structure, the trenches 9 are filled with an insulating material 28, and the top surface is planarized. Manufacture of a superjunction device on the structure follows by performing an implant 22, depositing the gate 20 in the implanted region and adding the gate conductor 26 and gate oxide 24, all done using methods well known in the art. Hence, the gate electrode layer 20 is formed in at least one of the trenches 9 and is formed on the first main surface. The gate electrode layer 20 is in ohmic contact with the first doped region. The gate electrode layer 20 is in ohmic contact with the first doped region. Preferably, the gate electrode layer 20 is in Schottky contact with the first doped region. The performance of devices built or formed on this structure have enhanced avalanche breakdown voltage ($V_b$) characteristics as compared to conventional semiconductor-transistor devices.

Thus, it can be seen that each of the preferred embodiments provides P-N junctions of the first and second doped regions located along the depth direction of the plurality of trenches 9. The fabrication of conventional metal-oxide semiconductor field effect transistor (MOSFET) device(s) on the active area can then take place using well known steps including forming a gate oxide layer 24, depositing and defining a gate conductor 26 and depositing a gate electrode 20. Additional steps complete the device by selectively implanting active regions of a second conductivity type followed by selectively implanting regions of a first conductivity type. Contacts to regions on the front surface and to the back surface are also made, and a passivation layer may be deposited and patterned to complete the device fabrication sequence.

From the foregoing, it can be seen that the present invention is directed to a semiconductor device and methods for manufacturing a semiconductor device. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit.

I claim:

1. A method of manufacturing a semiconductor device comprising:

providing a semiconductor substrate having first and second main surfaces opposite to each other, the semiconductor substrate having a heavily doped region of a first conductivity type at the second main surface and having a lightly doped region of the first conductivity type at the first main surface;

forming a plurality of trenches and a plurality of mesas in an active region of the substrate, each trench having a first extending portion extending from the first main surface toward the heavily doped region to a first depth position, each mesa having a sidewall surface, each of the plurality of trenches being separated from each of the other trenches by one of the plurality of mesas;

oxidizing a preselected area of the plurality of mesas and the plurality of trenches in the active region and extending into a termination region of the substrate which is outside and adjacent to the active region, until the oxidization covers the top of each mesa within the preselected area of the plurality of mesas, the sidewalls and the bottoms of each of the plurality of trenches and the top of the termination region;

etching the preselected area of the plurality of mesas and the plurality of trenches to remove the oxide in the bottoms of the plurality of trenches;

forming a protective shield over a preselected region at a border between the active region and the termination region;

partially removing the protective shield from over the preselected area of the plurality of mesas and the plurality of trenches;

implanting a dopant of the first conductivity type into at least one preselected mesa of the preselected area of the plurality of mesas and the plurality of trenches, at an adjacent pair of the plurality of trenches at a sidewall surface of one trench to form at the sidewall surface of the one trench a first doped region of the first conductivity type having a doping concentration lower than that of the heavily doped region;

implanting a dopant of the second conductivity type into the at least one mesa of the preselected area of the plurality of mesas and the plurality of trenches, at a sidewall surface of the at least one mesa opposite to the sidewall implanted with the dopant of the first conductivity type to provide a second doped region of the second conductivity type at the sidewall surface opposite to the sidewall implanted with the dopant of the first conductivity type;

filling the plurality of trenches with an insulating material; and planarizing the top surface of the structure.

2. The method according to claim 1, wherein the step of forming a protective shield comprises the following:

depositing a layer of photoresist over the preselected area of the plurality of mesas and the plurality of trenches;

positioning a mask so that the photoresist over the outer sidewall of the last trench on each side of the preselected area of the plurality of mesas and the plurality of trenches is protected and the remainder of the preselected area of the plurality of mesas and the plurality of trenches is unprotected;

subjecting the unprotected portion of photoresist to a medium for development of the photoresist, selected from a group including ultraviolet light, deep ultraviolet light, electron beams and x-rays; and wherein the step of removing partially the protective shield consists of:

removing a mask from over the preselected area of the plurality of mesas and the plurality of trenches;

removing the developed photoresist from the structure;

etching the preselected area of the plurality of mesas and the plurality of trenches, using a wet process oxide etch, to remove undeveloped photoresist and oxide from the preselected area of the plurality of mesas and the plurality of trenches, except from the outer sidewall of the last trench on each side of preselected area of the plurality of mesas and the plurality of trenches, where oxide was protected by the undeveloped photoresist, the oxide being preserved to block implantation of the outer sidewall of each such last trench.

3. The method according to claim 2, further comprising:

providing a third doped region of the second conductivity type at the first main surface of the first and second doped regions to be electrically connected to the second doped region;

providing a fourth doped region of the first conductivity type at at least one of the first main surface and a sidewall surface of the one trench such that the fourth doped region is opposite to the first doped region with the third doped region posed therebetween; and providing a gate electrode layer opposite to the third doped region between the first and fourth doped regions, with a gate insulation layer interposed therebetween.

4. The method according to claim 3, wherein the gate electrode layer is formed in at least one of the trenches.

5. The method according to claim 3, wherein the gate electrode layer is formed on the first main surface.

6. The method according to claim 1, wherein the step of forming a protective shield comprises:

etching the preselected area the plurality of mesas and the plurality of trenches using a dry process oxide etch to remove the oxide in the bottom and on the sides of each of the plurality of trenches;

positioning a mask so that only an opening in the mask is located over the last trench and the adjacent mesa area on each side of the active area;

depositing a layer of photoresist over the mask so that the last trench and the adjacent mesa area on each side of the active area are the only areas where photoresist is deposited; and wherein the step of partially removing the protective shield comprises:

removal of the mask which prevented photoresist from being deposited except in the last trench and on the mesa regions adjacent to the last trench.

7. The method according to claim 6, further comprising:

providing a third doped region of the second conductivity type at the first main surface of the first and second doped regions to be electrically connected to the second doped region;

providing a fourth doped region of the first conductivity type at either the first main surface or a sidewall surface of the plurality of trenches such that the fourth doped region is opposite to the first doped region with the third doped region posed therebetween; and providing a gate electrode layer opposite to the third doped region between the first and fourth doped regions, with a gate insulation layer interposed therebetween.

8. The method according to claim 6, wherein the gate electrode layer is formed on the first main surface.

9. The method according to claim 6, further comprising:
providing a third doped region of the second conductivity type at the first main surface of the first and second doped regions to be electrically connected to the second doped region.

10. The method according to claim 6, further comprising:
providing an electrode layer in ohmic contact with the first doped region.

11. The method according to claim 6, wherein a diffusion length of each of the dopants of the first and second conductivity types in manufacturing the semiconductor device is longer than a distance from the sidewall surfaces of the adjacent pair of trenches to a P-N junction of the first and second doped regions.

12. The method according to claim 1, further comprising providing a third doped region of the second conductivity type at the first main surface of the first and second doped regions to be electrically connected to the second doped region.

13. The method according to claim 1, further comprising:
providing an electrode layer in Schottky contact with the first doped region.

14. The method according to claim 1, wherein a diffusion length of each of the dopants of the first and second conductivity types in manufacturing the semiconductor device is longer than a distance from the sidewall surfaces of an adjacent pair of trenches to a P-N junction of the first and second doped regions.

15. The method according to claim 1, wherein each sidewall surface has a predetermined inclination angle maintained relative to the first main surface.

16. The method according to claim 1, wherein the etching of the preselected area of the plurality of mesas and the plurality of trenches is performed using a dry process oxide etch.

17. The method according to claim 1, wherein the implanting of the dopant of the first conductivity type is performed at a first predetermined angle of implant.

18. The method according to claim 1, wherein the implanting of the dopant of the second conductivity type is performed at a second predetermined angle of implant.

19. The method according to claim 1, further comprising:
forming a superjunction device on the structure.

20. A semiconductor device formed by the method of claim 1.

* * * * *

UNITED STATES PATENT AND TRADEMARK OFFICE
CERTIFICATE OF CORRECTION

| | | |
|---|---|---|
| PATENT NO. | : 7,041,560 B2 | Page 1 of 2 |
| APPLICATION NO. | : 11/009678 | |
| DATED | : May 9, 2006 | |
| INVENTOR(S) | : Fwu-Iuan Hshieh | |

It is certified that error appears in the above-identified patent and that said Letters Patent is hereby corrected as shown below:

Delete title page and substitute therefor the attached title page.

Column 12, line 22:

Delete claim 20 in its entirety.

Signed and Sealed this

Seventeenth Day of November, 2009

David J. Kappos
*Director of the United States Patent and Trademark Office*

United States Patent
Hshieh (12) United States Patent
(10) Patent No.: US 7,041,560 B2
(45) Date of Patent: May 9, 2006

(54) METHOD OF MANUFACTURING A SUPERJUNCTION DEVICE WITH CONVENTIONAL TERMINATIONS

(75) Inventor: Fwu-Iuan Hshieh, Saratoga, CA (US)

(73) Assignee: Third Dimension (3D) Semiconductor, Inc., Tempe, AZ (US)

(*) Notice: Subject to any disclaimer, the term of this patent is extended or adjusted under 35 U.S.C. 154(b) by 0 days.

(21) Appl. No.: 11/009,678

(22) Filed: Dec. 10, 2004

(65) Prior Publication Data
US 2005/0181558 A1    Aug. 18, 2005

Related U.S. Application Data

(60) Provisional application No. 60/531,501, filed on Dec. 19, 2003.

(51) Int. Cl.
*H01L 21/336* (2006.01)
*H01L 21/8238* (2006.01)

(52) U.S. Cl. .................. 438/268; 438/212; 438/282; 438/289; 438/514

(58) Field of Classification Search .............. 438/272, 438/212, 282
See application file for complete search history.

(56) References Cited

U.S. PATENT DOCUMENTS

| | | | |
|---|---|---|---|
| 4,158,206 A | 6/1979 | Neilson | |
| 4,895,810 A | 1/1990 | Meyer et al. | |
| 5,019,522 A | 5/1991 | Meyer et al. | |
| 5,045,903 A | 9/1991 | Meyer et al. | |
| 5,216,275 A | 6/1993 | Chen | |
| 5,366,914 A | 11/1994 | Takahashi et al. | |
| 5,435,888 A | 7/1995 | Kalnitsky et al. | |
| 5,472,888 A | 12/1995 | Kinzer | |
| 5,506,421 A | 4/1996 | Palmour | |
| 5,598,018 A | 1/1997 | Lidow et al. | |
| 5,742,087 A | 4/1998 | Lidow et al. | |
| 5,744,994 A | 4/1998 | Williams | |
| 5,786,619 A | 7/1998 | Kinzer | |
| 5,902,127 A | 5/1999 | Park | |
| 5,929,690 A | 7/1999 | Williams | |
| 5,939,754 A | 8/1999 | Hoshi | |
| 6,081,009 A * | 6/2000 | Neilson | 257/341 |
| 6,184,555 B1 | 2/2001 | Tihanyi et al. | |
| 6,190,970 B1 | 2/2001 | Liao et al. | |
| 6,198,127 B1 | 3/2001 | Kocon | |
| 6,214,698 B1 | 4/2001 | Liaw et al. | |
| 6,222,229 B1 | 4/2001 | Herbert et al. | |
| 6,239,463 B1 | 5/2001 | Williams et al. | |

(Continued)

*Primary Examiner*—Ha Nguyen
*Assistant Examiner*—Cheung Lee
(74) *Attorney, Agent, or Firm*—Akin Gump Strauss Hauer & Feld, L.L.P (57) ABSTRACT

A method of manufacturing a semiconductor device includes providing a semiconductor substrate having a heavily doped region of a first conductivity and has a lightly doped region of the first conductivity. The semiconductor substrate a plurality of trenches etched into an active region of the substrate forming a plurality of mesas. A preselected area in the active region is oxidized and then etched using a dry process oxide etch to remove the oxide in the bottoms of the trenches. A protective shield is formed over a region at a border between the active region and the termination region. The protective shield is partially removed from over the preselected area. Dopants are implanted at an angle into mesas in the preselected area. The plurality of trenches are with an insulating material, the top surface of the structure is planarized and a superjunction device is formed on the structure.

19 Claims, 9 Drawing Sheets